(12) United States Patent
Marion et al.

(10) Patent No.: US 9,406,662 B2
(45) Date of Patent: Aug. 2, 2016

(54) FLIP-CHIP ASSEMBLY PROCESS COMPRISING PRE-COATING INTERCONNECT ELEMENTS

(71) Applicant: COMMISSARIAT A L'ENERGIE ATOMIQUE ET AUX ENERGIES ALTERNATIVES, Paris (FR)

(72) Inventors: François Marion, Saint Martin le Vinoux (FR); Alexis Bedoin, Saint Victor sur Loire (FR); Frédéric Berger, Saint Marcellin (FR); Alain Gueugnot, Sassenage (FR)

(73) Assignee: COMMISARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/763,095

(22) PCT Filed: Mar. 21, 2014

(86) PCT No.: PCT/FR2014/050665
§ 371 (c)(1),
(2) Date: Jul. 23, 2015

(87) PCT Pub. No.: WO2014/147355
PCT Pub. Date: Sep. 25, 2014

(65) Prior Publication Data
US 2015/0380395 A1 Dec. 31, 2015

(30) Foreign Application Priority Data
Mar. 22, 2013 (FR) .................... 13 52557

(51) Int. Cl.
*H01L 25/00* (2006.01)
*H01L 23/00* (2006.01)
(Continued)

(52) U.S. Cl.
CPC ............. *H01L 25/50* (2013.01); *H01L 24/13* (2013.01); *H01L 24/16* (2013.01); *H01L 24/27* (2013.01);
(Continued)

(58) Field of Classification Search
CPC ......... H01L 25/50; H01L 24/10; H01L 24/13; H01L 24/16; H01L 21/561; H01L 24/27; H01L 24/29; H01L 24/32; H01L 24/81; H01L 24/83; H01L 24/92
See application file for complete search history.

(56) References Cited

U.S. PATENT DOCUMENTS

| 6,179,198 B1 * | 1/2001 | Eifuku ................. B23K 1/0016 228/103 |
| 7,393,419 B2 * | 7/2008 | Sachdev ................... C08K 3/08 134/26 |

(Continued)

FOREIGN PATENT DOCUMENTS

| EP | 2287904 A1 | 2/2011 |
| JP | 2003249524 A | 9/2003 |

OTHER PUBLICATIONS

International Search Report issued in Application No. PCT/FR2014/050665 dated Jul. 15, 2014.

*Primary Examiner* — Savitr Mulpuri
(74) *Attorney, Agent, or Firm* — Marshall, Gerstein & Borun LLP

(57) ABSTRACT

A method of assembling a first and a second electronic components includes forming connection elements on an assembly surface of the first component and forming connection elements on an assembly surface of the second component. The method also includes depositing a liquid layer of electrically-insulating curable material on the assembly surface of the first and/or of the second component and arranging the first and second components on each other to place the connection elements of the second component in front of the connection elements of the first component. The method further includes applying a force along a predetermined direction and the first and/or the second components to create electric interconnects each formed of a connection element of the first component and of a connection element of the second component and curing the curable material.

8 Claims, 5 Drawing Sheets

(51) Int. Cl.
*H01L 27/146* (2006.01)
*H01L 21/56* (2006.01)

(52) U.S. Cl.
CPC ............... *H01L 24/29* (2013.01); *H01L 24/81* (2013.01); *H01L 24/83* (2013.01); *H01L 24/92* (2013.01); *H01L 27/1465* (2013.01); *H01L 21/561* (2013.01); *H01L 24/32* (2013.01); *H01L 2224/13011* (2013.01); *H01L 2224/13015* (2013.01); *H01L 2224/1318* (2013.01); *H01L 2224/1357* (2013.01); *H01L 2224/13109* (2013.01); *H01L 2224/13111* (2013.01); *H01L 2224/13116* (2013.01); *H01L 2224/13118* (2013.01); *H01L 2224/13124* (2013.01); *H01L 2224/13139* (2013.01); *H01L 2224/13147* (2013.01); *H01L 2224/13155* (2013.01); *H01L 2224/13166* (2013.01); *H01L 2224/13169* (2013.01); *H01L 2224/13184* (2013.01); *H01L 2224/13186* (2013.01); *H01L 2224/13562* (2013.01); *H01L 2224/13609* (2013.01); *H01L 2224/13611* (2013.01); *H01L 2224/13616* (2013.01); *H01L 2224/13618* (2013.01); *H01L 2224/13624* (2013.01); *H01L 2224/13639* (2013.01); *H01L 2224/13644* (2013.01); *H01L 2224/13647* (2013.01); *H01L 2224/13669* (2013.01); *H01L 2224/16052* (2013.01); *H01L 2224/16148* (2013.01); *H01L 2224/16238* (2013.01); *H01L 2224/2741* (2013.01); *H01L 2224/27618* (2013.01); *H01L 2224/2919* (2013.01); *H01L 2224/73104* (2013.01); *H01L 2224/73204* (2013.01); *H01L 2224/81099* (2013.01); *H01L 2224/81193* (2013.01); *H01L 2224/81194* (2013.01); *H01L 2224/83191* (2013.01); *H01L 2224/83859* (2013.01); *H01L 2224/83862* (2013.01); *H01L 2224/83868* (2013.01); *H01L 2224/83871* (2013.01); *H01L 2224/83874* (2013.01); *H01L 2224/83986* (2013.01); *H01L 2224/9211* (2013.01); *H01L 2224/92125* (2013.01); *H01L 2224/94* (2013.01); *H01L 2224/97* (2013.01)

(56) References Cited

U.S. PATENT DOCUMENTS

| | | | |
|---|---|---|---|
| 8,048,766 B2* | 11/2011 | Joly | B81C 1/00253 257/531 |
| 8,779,588 B2* | 7/2014 | Yu | H01L 24/13 257/734 |
| 8,928,141 B2* | 1/2015 | Souriau | H01L 24/13 257/737 |
| 2002/0016022 A1 | 2/2002 | Shintani | |
| 2002/0104873 A1* | 8/2002 | Lee | H01L 21/563 228/180.22 |
| 2003/0109077 A1 | 6/2003 | Kim et al. | |
| 2006/0091504 A1* | 5/2006 | Kang | H01L 24/81 257/643 |
| 2006/0281309 A1 | 12/2006 | Trezza | |
| 2008/0146071 A1* | 6/2008 | Davoine | H01L 24/11 439/387 |
| 2012/0178218 A1 | 7/2012 | Bauer et al. | |
| 2015/0380395 A1* | 12/2015 | Marion | H01L 25/50 438/108 |

* cited by examiner

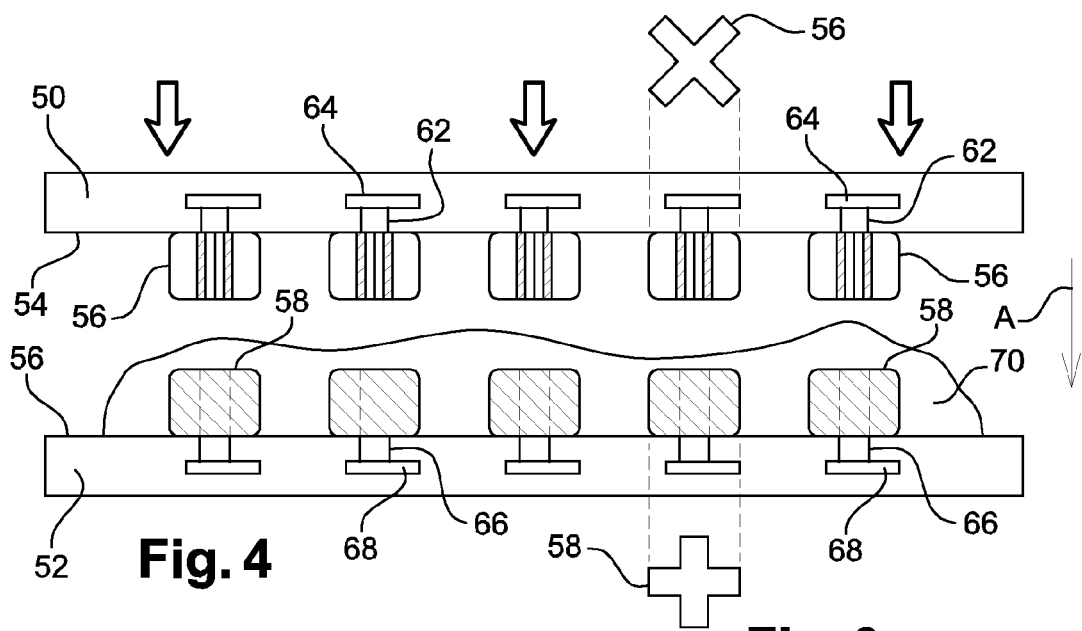
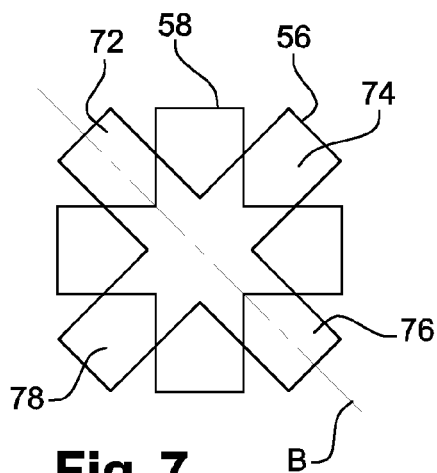
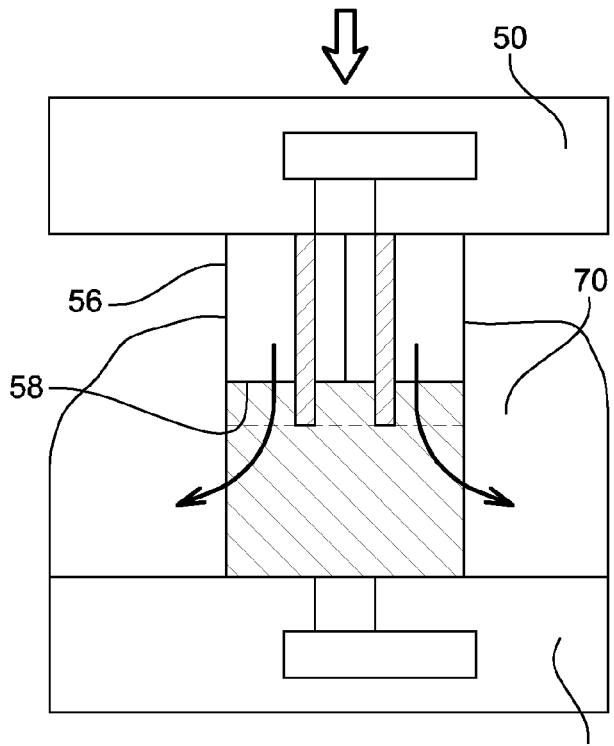

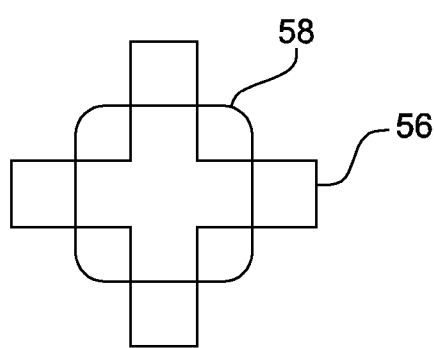
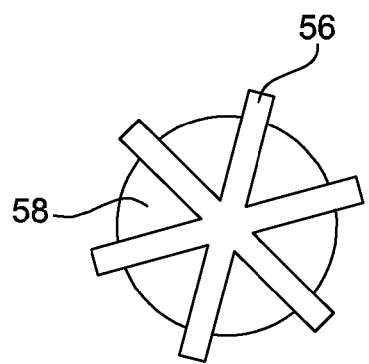
Fig. 11   Fig. 12
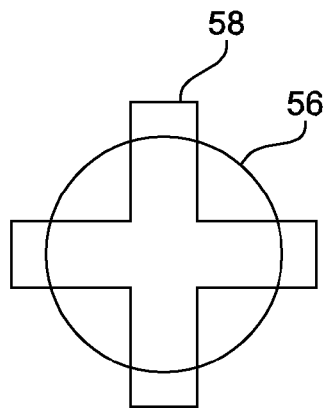
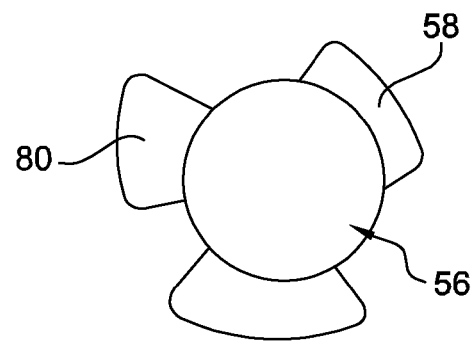
Fig. 13   Fig. 14
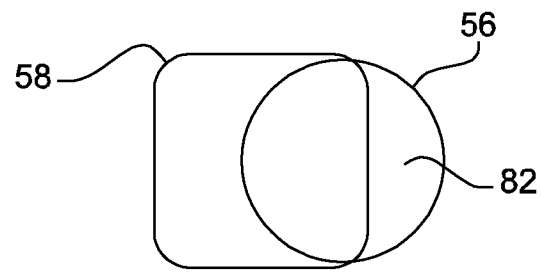
Fig. 15

FLIP-CHIP ASSEMBLY PROCESS COMPRISING PRE-COATING INTERCONNECT ELEMENTS

CROSS-REFERENCE TO RELATED APPLICATIONS

This application is a national stage application under 35 U.S.C. §371 and claims the benefit of priority of international application no. PCT/FR2014/050665, filed Mar. 21, 2014, which claims the benefit of priority under 35 U.S.C. §119 of French patent application no. 1352557, filed Sep. 25, 2014, and the entire contents of each is hereby incorporated herein by reference, in its entirety and for all purposes.

TECHNOLOGICAL FIELD

The present disclosure relates to microelectronics, and more particularly to the assembly of two electronic components according to the so-called flip-chip technique, which forms vertical interconnects between the two components.

The present disclosure thus specifically applies in so-called chip-to-chip, chip-to-wafer, and wafer-to-wafer assemblies.

The presently described embodiments advantageously apply to devices requiring very small pitch metal pattern interconnects, particularly for the manufacturing of imagers of very large dimensions and a very small pitch, such as for example large heterogeneous arrays comprising a large number of connections, cold-hybridized temperature-sensitive detection arrays, or also detection arrays sensitive to mechanical stress. The presently described embodiments also advantageously apply to so-called "3D" structures, which comprise a stack of circuits made of different materials and accordingly sensitive to thermal stress. The presently described embodiments also particularly apply to high-sensitivity detectors capable of detecting a small number of photons, particularly a single photon. The presently described embodiments also apply to the cold hybridization of components.

BACKGROUND

The assembly of two electronic components by the so-called "flip-chip" thermocompression technique usually comprises forming electrically-conductive solder balls on a surface of a first electronic component and on a surface of a second component according to a predetermined connection pattern. The first component is then placed on the second component to place their respective solder balls in front of one another, after which the assembly is pressed and heated. The balls placed into contact then deform and melt to form electric connections perpendicular to the main plane of the electronic components, generally in the form of a wafer.

Although "flip-chip" hybridization has many advantages, two problems are however posed for this type of hybridization.

First, a recurrent problem in this type of hybridization lies in the fact that, when no specific measure is taken, the ball surface oxidizes, which creates electric connections of poor quality between the hybridized components. Indeed, not only are metal oxides very poor electric power conductors, but also does the oxide present at the surface of the balls oppose the blending of the balls during the hybridization.

To avoid for balls to be thermo-compressed while they have at their surface a native oxide layer, that is, an oxide layer obtained by the natural oxidation of the metal when it is contact with oxygen, the balls are usually submitted, prior to the hybridization, or during the hybridization, to deoxidizing agents, commonly called "deoxidizing flux" which dissolve the oxide layer. The deoxidizing flux usually is an acid, such as for example benzoic or carboxylic acid. Reference may for example be made to documents JP 2012077214, EP 1 621 566, or U.S. Pat. No. 6,197,560 for examples of deoxidizing fluxes.

Then, the vertical interconnects obtained by the hybridization are sensitive to thermal stress, and this, all the more as the first and second components are made of different materials. Indeed, the components most often have different thermal expansion coefficients, so that under the effect of a temperature variations, the interconnects are submitted to a shearing which embrittles them and breaks them.

To increase the thermo-mechanical reliability of a hybridized assembly and provide a protection of interconnects against the environment, it is generally provided to fill the space separating the two components with a resin layer known as "underfill", the action of filling this space being known as "underfilling". The shearing forces are thus distributed all over the layer separating the two hybridized components, and no longer on the interconnects only, the latter being thus efficiently protected.

Two techniques for filling the volume separating the two components hybridized by the solder balls are known, the first one being known as "fast flow", and the second being known as "no-flow". Such techniques are for example described in document "*Characterization of a No-Flow Underfill Encapsulant During the Solder Reflow Process*", of C. P. Wong et al., Proceedings of the Electronic Components and Technology Conference, 1998, pages 1253-1259.

The "fast-flow" technique follows the hybridization of the components. Particularly, during the hybridization, the components are submitted to the deoxidizing flux and heated up to a temperature higher than or equal to the melting temperature of the metal balls. Once the balls have been soldered, a cleaning of the deoxidizing flux present between the components is then implemented to avoid for the latter to create short-circuits between interconnects and to corrode them. Once the cleaning has been performed, the "fast-flow" technique then comprises depositing, on one or a plurality of edges of one of the components, liquid resin, that is, non-cured resin. The underfill resin then migrates by capillarity between the hybridized components and fills the volume separating them. The assembly is then submitted to a thermal treatment, or "curing", to solidify the resin.

This technique is however very long due to the slowness both of the resin migration and of the thermal treatment. Further, the migration time increases according to the density of interconnects between the components, so that this technique is less and less adapted to the manufacturing of components having a high interconnect density.

The "no-flow" technique has been mainly developed to perform a fast filling of the volume between the hybridized components, and is now described in relation with the simplified cross-section views of FIGS. 1 to 3 in the context of a "flip chip" solder ball hybridization.

In a first step, coating resin 40 is deposited on a first electronic component 12a provided with solder balls 18a so as to cover them (FIG. 1).

In a second step, a second electronic component 12b, provided with solder balls 18b, is aligned on first component 12a, after which a pressure is exerted on the second component along the illustrated arrows by further raising the temperature of the assembly up to a temperature higher than or equal to the melting temperature of the metal forming balls 18a, 18b (FIG. 2). Balls 18a, 18b then bond to one another by thermocompression to form interconnects 42, resin 40 further occupying the volume between components 12a, 12b where interconnects 42 are housed (FIG. 3). Further, a heating being exerted to thermo-compress solder balls 18a, 18b, this heating is selected to activate the thermal treatment of resin 40 in order to cure it. As compared with the "fast flow" technique, it is thus not necessary to carry out a previous cleaning step, and a single heating step is implemented. There further is no migration of the resin, which is directly deposited at the location that it should subsequently occupy. The "no-flow" technique is thus fast.

Such a technique however has a number of disadvantages. First, as previously described, to form high-quality interconnects, the oxide layer covering balls 18a, 18b should be removed before their blending by thermocompression. For this purpose, the resin comprises a deoxidizing flux.

As known per se, the resin is a mixture of glue as a main component, for example, epoxy glue, and of a solvent which enables to adjust the viscosity of the resin and which is evaporated during the thermal treatment of the resin. The mixture may also comprise curing agents, particularly polymerizing agents, for example, a catalyst, a photoinitiator or a thermal initiator, and/or surface-active agents, for example, silane, which increases the bonding and the wettability of the resin on the surfaces of the components with which it has entered into contact, and/or particles for adjusting the thermal expansion coefficient of the resin, usually called "fillers".

In the context of the "no flow", deoxidizing flux is thus also incorporated in the resin to dissolve the oxide layer covering solder balls 18a, 18b.

However, deoxidizing agents comprise ionic agents of high electric conductivity. Since they are present in the resin and cannot be removed therefrom, once the coating is over, such agents thus limit the electric resistivity of the resin, which may take values smaller than $10^{12}$ Ω/cm. Certain applications, particularly in cooled infrared detection, require resistivities greater than $2.10^{13}$ Ω/cm, thus making the "no-flow" technique unfit for such applications.

SUMMARY

The presently described embodiments aim at providing a "flip-chip" hybridization method which enable to form a coating or "underfilling", of "no-flow" type, having an increased electric resistivity.

For this purpose, the presently described embodiments aim at a method of assembling a first and a second electronic components, comprising:

forming connection elements on an assembly surface of the first component and forming connection elements on an assembly surface of the second component;

depositing a liquid layer of electrically-insulating curable material on the assembly surface of the first and/or of the second component to coat at least the connection elements formed on said surface;

arranging the first and second components on each other to place the connection elements of the second component in front of the connection elements of the first component;

applying a force along a preset direction on the first and/or the second components to create electric interconnects, each formed of one connection element of the first component and of one connection element of the second component;

and curing the curable material.

According to the presently described embodiments:

the connection elements of the first components are hollow inserts having an open end and the connection elements of the second components are solid elements, having a lower hardness than the inserts, the application of the force resulting in the hollow elements being inserted into the solid elements;

each insert comprises:

a metal core, which is not oxidized over at least a portion of its surface, and having a greater hardness than the solid elements; and a metal layer covering at least said non-oxidized portion of the core, the first layer having a greater plasticity than the core and/or being made of a non-oxidizable material;

the geometry of the hollow inserts and the geometry of the solid elements, and/or the relative positioning thereof during the insertion, are selected to leave a portion of the open end of the hollow inserts free during the insertion;

and the curable material comprises no deoxidizing flux.

"Electrically insulating" means a material of high electric resistivity, particularly materials having a resistivity greater than $10^{12}$ Ω/cm.

"Liquid" here means the phase of the curable material when said material is not solid.

In other words, during the insertion of a hollow insert into a solid element, the latter does not totally obstruct the opening of the insert. There thus is a leakage path, or "vent", for the material contained in the insert. As the hollow inserts advances in the solid element, the material is thus expelled. Accordingly, the cross-section of the insert bearing on the solid element during the insertion is that of the hollow insert. In particular, since the insert has a small cross-section, the pressure exerted on the solid element by the insert is sufficient to break the oxide layer covering the solid element.

Further, according to at least an embodiment, when the insert is formed of a core covered with a non-oxidizable metal layer, this layer is thus fitted into the solid element and forms therewith a high-quality interconnect. It is thus not necessary to provide a deoxidizing flux in the coating material to ensure the quality of the interconnect. The coating material being flux-less, it accordingly has a high electric resistivity. It is thus possible to select coating materials having a very high resistivity, that is, a resistivity greater than $10^{12}$ Ω/cm.

Similarly, according to at least an embodiment, when the insert is made of a metal core covered with a metal layer having a greater plasticity than the core, under the effect of the insertion into the solid element, the different regions of the insert undergo a deformation. Since it has a greater plasticity than the core, the metal layer will thus be more strongly deformed than said core during the penetration into a bump. Also, if this metal layer is further covered with a native oxide layer, the native oxide layer cannot deform as much as the metal layer without breaking, since the oxide layer, which is very brittle, has a lower plasticity than the metal layer. Since it cannot follow the deformation undergone by the metal layer, the native oxide layer "cracks". Since, further, an oxide layer has a low bonding to the metal from which it originates, the native oxide layer "peels" by slipping on the metal layer under the effect of a shearing exerted on insertion and thus remains outside of the solid element, then totally exposing the metal layer. A high-quality electric interconnect is thus obtained without using a deoxidizing flux in the underfill material.

The presently described embodiments thus enable to combine the advantages of a "flip chip" hybridization at a decreased pressure due to the use of hollow and open inserts, with the advantages of a fast underfilling, due to the use of the "no flow" underfill technique. Particularly, the hybridization is advantageously performed at ambient temperature, without requiring to heat the connection elements to obtain the melting thereof.

According to an embodiment, a length of the hollow inserts along an axis perpendicular to the assembly direction is greater than a length of the solid elements along said axis.

According to an embodiment, the hollow inserts are inserted on one edge of the solid elements.

According to an embodiment, the open end of the hollow inserts has a plurality of branches partially arranged outside of the solid elements during the insertion.

According to an embodiment, the curable material comprises no deoxidizing flux.

According to an embodiment, the layer of curable material is deposited on a predetermined portion of the assembly surface, the curable material is a negative photoresist capable of becoming insoluble in a predetermined developer consecutively to the application of a predetermined radiation, and consecutively to the insertion of the hollow inserts into the solid elements:

said radiation is applied to the resist layer except for the resist layer portion covering said portion of the assembly surface; and the resist covering said area is removed by applying the developer.

BRIEF DESCRIPTION OF THE DRAWINGS

The present disclosure will be better understood on reading of the following description provided as an example only in relation with the accompanying drawings, where the same reference numerals designate the same or similar elements, among which:

FIGS. 4 to 8 are simplified cross-section and top views illustrating a "flip chip" hybridization method with a "no flow" underfill;

FIGS. 11 to 15 are simplified top views illustrating different variations of hollow open inserts and of solid elements.

DETAILED DESCRIPTION

Figure 1:
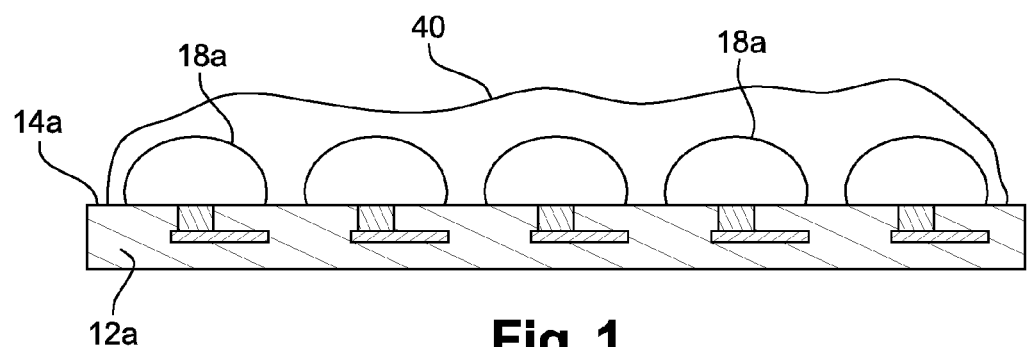
FIGS. 1 to 3 are simplified cross-section views illustrating a prior art "no flow"-type underfill technique applied to a "flip chip" hybridization by thermocompression of solder balls.
Figure 2:
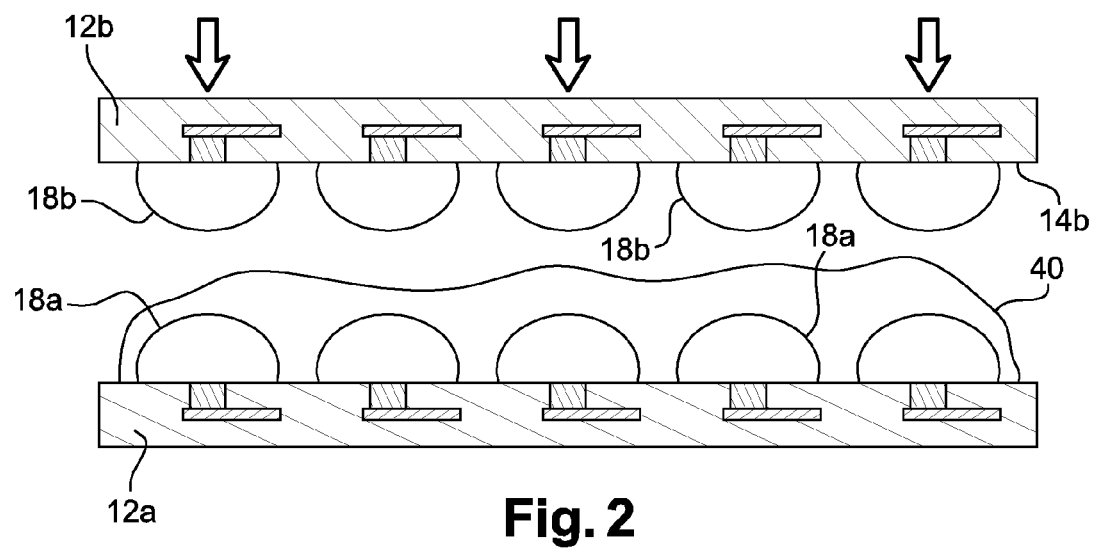
Figure 3:
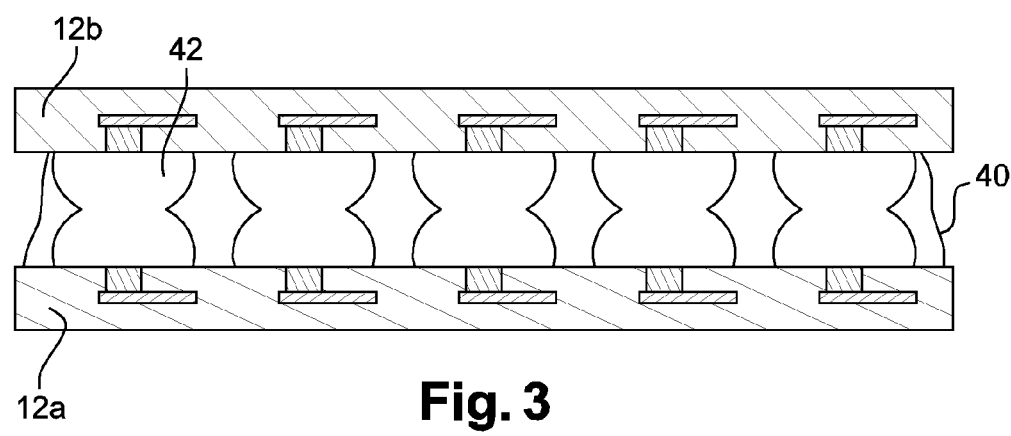

FIGS. 4 to 8 schematically illustrate the "flip-chip" hybridization of a first and of a second electronic components 50, 52 by a hybridization method according to the present disclosure.

Referring to FIG. 4, first component 50 comprises on one of its surfaces 54, called "assembly" surface, a set of open electrically-conductive hollow inserts 56 intended to penetrate into respective electrically-conductive solid bumps 58 arranged on one of the so-called "assembly" surfaces 60 of second component 52. The bottom of insert 56 is further in contact with a connection area 62 formed across the thickness of first component 50, area 62 forming the interface, for example, with an electronic circuit 64. Similarly, each bump 58 is in contact with a connection area 66 formed across the thickness of the second component 52, area 66 forming the interface, for example, with an electronic circuit 68.

The hollow insert is advantageously made of a hard material, such as, in particular, W, WSi, TiN, Cu, Pt, or Ni, covered with a layer of noble metal, such as, in particular, Au or Pt, which is thus non-oxidizable, to avoid the forming of oxide at the surface, which would weaken the electric contact with the solid element. The solid element preferably made of In or of an In-based compound, such as for example, InSb, an alloy based on tin, lead, Al or an Al alloy, such as, for example, AlCu.

A volume of curable material 70, particularly a resin such as previously described, for example, an epoxy resin comprising a curing agent, is further deposited in liquid form on the portion of surface 56 comprising bumps 58 to coat them.

To perform the hybridization, preferably at a cold temperature, electronic components 50 and 52 are aligned to have each hollow insert 56 in front of a bump 58, and an appropriate pressure, illustrated by arrows is exerted on the first component, which is mobile and thus displaces along an assembly direction A. Once in contact with underfill material 70, the hollow inserts then fill therewith by capillarity.

Advantageously, the geometry of hollow inserts 56 and the geometry of solid bumps 58 are selected so that, on insertion of hollow inserts 56 into bumps 58, bumps 58 do not totally obstruct the aperture of hollow inserts 56. Thereby, there is a leakage path for underfill material 70 occupying the inserts as said inserts advance into bumps 58 so that the section bearing on bumps 58 is that of inserts 56.

For example, hollow inserts 56 each have a cross-section perpendicular to assembly direction A, or "transverse cross-section" taking the shape of a cross (FIG. 5) and bumps 58 each have a cross-section perpendicular to direction A taking the shape of a cross angularly offset by 45° with respect to the cross of the corresponding insert 56 and centered thereon (FIG. 6).

Thus, when a pressure is exerted on first component 50, inserts 56, which have a greater hardness than bumps 68, then penetrate into said bumps by breaking the native oxide layer possibly covering bumps 58. Due to the offset between the crosses of inserts 56 and of bumps 58, such as illustrated in FIG. 7, there exist four portions 72, 74, 76, 78 of inserts 56 which are not covered with bumps 58, thus creating four paths, or vents, for underfill material 70 occupying inserts 56. Thus, as inserts 56 advance in bumps 58, the underfill material is expelled from the inserts, as illustrated by the arrows in detail view 8, and electric interconnects are formed between bumps 58 and inserts 56 covered with a layer of noble metal.

Thus, the only bearing surface of inserts 56 on bumps 58 is formed of the thickness of the inserts, so that the pressure exerted to hybridize the two components 50, 52 is low. Further, only a portion of the cross-section of inserts 56 is effectively introduced into bumps 58, which further enables to decrease said pressure. Electric interconnects between first and second electronic components 50, 52 are thus formed and mechanically attach the latter.

In parallel, or consecutively to the application of the pressure to hybridize components 50, 52, a thermal treatment, for example, a heating, may be applied to cure underfill materials 70 in order to obtain a solid layer of protection against thermo-mechanical stress filling the volume separating the two components at the level of the created interconnects.

Preferably, the assembly material is selected to comprise no deoxidizing agent, which provides for the latter resistivity values greater than $10^{12}$ Ω/cm, or even values greater than $2.10^{13}$ Ω/cm, which are in particular desirable for an application to infrared detection, for example, cooled infrared detection.

Figure 9:
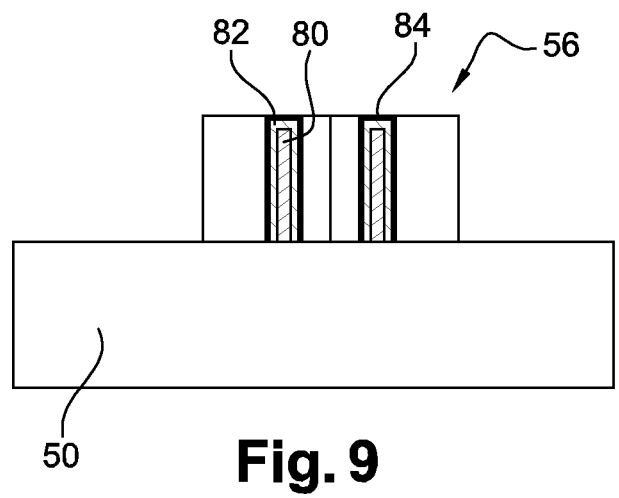
FIGS. 9 and 10 are simplified cross-section views respectively of an alternative embodiment of the inserts and of the peeling of an oxide layer covering the inserts during the penetration of the inserts into the solid elements.

According to a second alternative embodiment of inserts 56 illustrated in FIG. 9, inserts 56 each comprise a central metallic core 80 covered with a metal layer 82. Central core 80 has a greater hardness than bumps 58 so as to be insertable thereinto. For this purpose, central core 80 preferably has a Young's modulus greater than 1.5 time the Young's modulus of the material of bumps 58. Advantageously, central core 80 is made of a hard metal, such as titanium nitride (TiN), copper (Cu), vanadium (V), molybdenum (Mo), nickel (Ni), titanium tungstenate (TiW), WSi, or tungsten (W), for example, and bumps 58 are made of a ductile metal, for example, aluminum, tin, indium, lead, silver, copper, zinc, or an alloy of these metals. Further, central core 80 is not oxidized.

Metal layer 82, apart from its function of being electrically-conductive and of strongly bonding to central core 80 due to the metal-metal interface that it forms with core 80, has the function of deforming, while remaining attached to core 80, during the penetration of the insert into a bump. For this purpose, it has a plasticity greater than that of core 80. Layer 82 can thus be made of a ductile material. Particularly, a ductile metal having a Young's modulus greater than 1.5 time that of the material of core 80 has an appropriate plasticity.

Preferably, layer 82 has a ductility substantially equal to that of bumps 58 to enable hard core 80 to penetrate without breaking and to obtain relative deformations of layer 82 and of bump 58 in substantially equal fashion. Layer 80 is thus advantageously made of aluminum, tin, indium, lead, silver, copper, zinc, or of an alloy of these metals, and preferably of aluminum, this metal having the advantage of having a very high melting temperature greater than 500° C.

A native oxide layer 84, originating from the oxidization of layer 82, may further be present. Oxidation layer 84 is very thin by nature, in the order of a few nanometers, hard and brittle, and particularly with a plasticity and a ductility much smaller than those of the metal of layer 82, and only slightly bonds thereto. This embodiment has the advantage that no specific measures are necessary to avoid the oxidation of inserts during their storage since oxidizing inserts 56 are left to oxidize on purpose.

Figure 10:
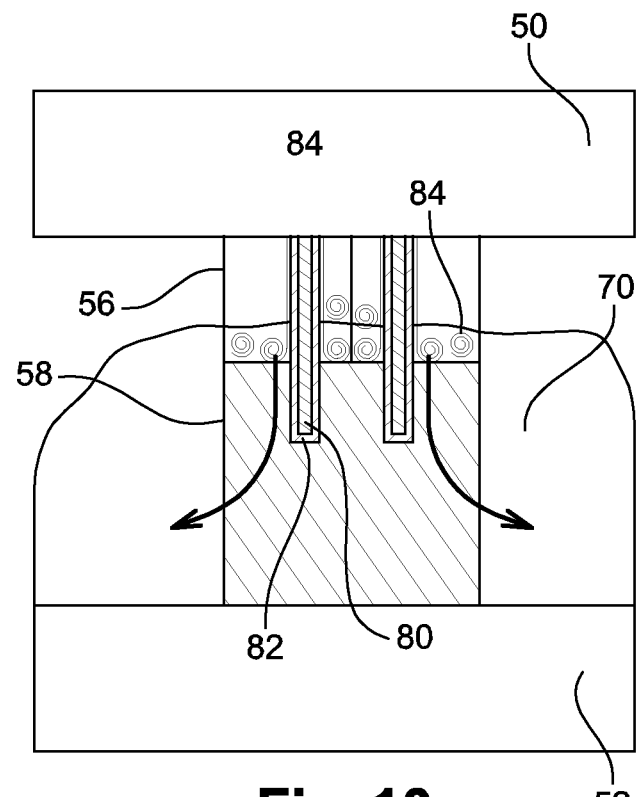

As illustrated in FIG. 10, during the penetration of an insert 56 into a bump 58, a deformation, even slight, of metal layer 82, breaks oxide layer 84 into plates, and, under the effect of shearing, the plates of native oxide slide on metal layer 82 while remaining outside of bump 58. Oxide layer 84 is thus peeled off during the insertion, thus exposing metal layer 82, thereby creating a high-quality, and especially oxide-free, electric connection.

Other geometric shapes are of course possible for the inserts and/or the bumps. It is for example sufficient, on insertion, for one dimension of the inserts along an axis perpendicular to direction A to be greater than a dimension of the bumps along the same axis, for example, axis B in FIG. 7, and/or for the inserts to be introduced on the edge of the bumps.

FIGS. 11 to 15 are top views of alternative embodiments of inserts 56 and of elements 58.

According to a variation illustrated in FIG. 11, the transverse cross-section of hollow open inserts 56 take the shape of a cross, as previously described, and the transverse cross-section of the solid elements takes any shape, but preferably a convex shape, for example, a square, disk, ellipse, rectangle, or other shape. The dimensions of the inserts and of the solid elements are then selected so that the branches of the inserts protrude on each side of the solid elements, thus creating four pathways enabling the underfill material to be drained out during the insertion.

According to a variation illustrated in FIG. 12, the transverse cross-section of inserts 56 Takes the shape of a star comprising more than four branches, for example, 6. Multiplying the number of pathways enables to minimize the risk of seeing underfill material trapped in the inserts, due, for example, to a manufacturing defect of the inserts and of the solid elements. Solid elements 58 may take any shape, but preferably, a convex shape, for example, a square, disk, ellipse, rectangle, or other shape.

According to a variation illustrated in FIG. 13, solid elements 58 have a cross- or star-shaped transverse cross-section, and the transverse cross-section takes any shape, but preferably a convex shape, for example, a square, disk, ellipse, rectangle, or other shape.

According to a variation illustrated in FIG. 14, inserts 56 are cylindrical and the solid elements comprise lobes 68, inserts 50 being centered, not necessarily precisely, at the location where lobes 60 meet.

According to a variation illustrated in FIG. 15, inserts 56 and solid elements 58 are those of the state of the art, particularly cylindrical inserts and convex solid elements 58, for example, of square or circular cross-section. On assembly of first electronic component 50 with second electronic component 52, each open hollow insert 56 is arranged vertically in line with a solid element 58, so that a portion 82 of the opening of inserts 56 is not located opposite elements 58. Advantageously, the patterns formed by inserts 56 on the surface of assembly of first component 50 are offset with respect to the pattern formed by elements 58 on the assembly surface of second component 52. This pattern offset is for example obtained on manufacturing of components 50 and 52 followed by the implementation of a conventional alignment of the components, or the manufacturing of inserts 56 and of elements 58 is conventionally formed and components 50 and 52 are then offset during the insertion.

As a numerical example, the present disclosure applies to an infrared detector intended to operate in space. The first component is an infrared detection array for a spatial application of 2,000*2,000 unit detection elements made of InGaAs on an InP substrate, or "pixels", distributed with a 10-micrometer pitch, and the second component, with which the detection array is hybridized, is a CMOS readout array provided with indium bumps. The size of the detection array thus is 20*20 mm.

Due to the strong difference between the thermal expansion coefficients of the detection array and of the readout array, it cannot be envisaged to perform a high-temperature hybridization of the two components, particularly by implementing a thermocompression of solder balls. Then, the vertical interconnects between the two components require being coated to guarantee a reliability of the detection with respect to strong cyclic thermal variations when the detector is in orbit. Further, the detector should be able to have a very low detection threshold, in the order of a few photons, whereby the underfill material should have a very high resistivity, greater than or equal to $10^{12}$ Ω/cm, or even to $2.10^{13}$ Ω/cm.

The hybridization method then comprises successively implementing the steps of:

1. manufacturing open tubes of cross-shaped transverse cross-section having a 5-micrometer height with a 10-micrometer pitch on a surface of the CMOS readout array;

2. manufacturing indium bumps having a 5-micrometer height with a 10-micrometer pitch on a surface of the InGaAs detection array;

3. dispensing a layer having a 5.5-micrometer thickness of epoxy glue or photoresist with no deoxidizing agents on the surface of the CMOS array comprising the tubes, for example, by means of a spin coater known per se;

4. removing the epoxy glue from areas where it is not desired to be found, such as for example areas comprising bumps intended for wire bonding connections, for example, by implementing a technique of photomasking of these areas, as described hereafter;

5. hybridizing the detection array and the readout array, for example, by a C2W-type hybridization (chip to wafer) in the context of a collective detector manufacturing, by insertion of the bumps of the readout array into the cross inserts of the readout array; and 6. crosslinking the epoxy glue coating the vertical interconnects thus obtained, the epoxy glue being further preferably selected to crosslink at ambient temperature if the arrays are very sensitive to strong thermal cycles.

Epoxy resins having photosensitive properties are so-called "negative resists". As known per se, an epoxy photoresist submitted to a specific light radiation, particularly, an ultraviolet radiation, becomes insoluble in a specific chemical bath called "developer". Thus, by partially exposing an epoxy resist layer to an ultraviolet radiation, and by then applying a developer to this layer, the portion exposed to the radiation is maintained while the non-exposed portion is removed. The protection against irradiation being usually obtained by means of a mask, the negative imprint of the mask is thus kept, whereby the name "negative" resist.

A method according to the present disclosure applied to components where areas should not be covered with underfill material will now be described in relation with FIGS. 16 to 19.

Figure 16:
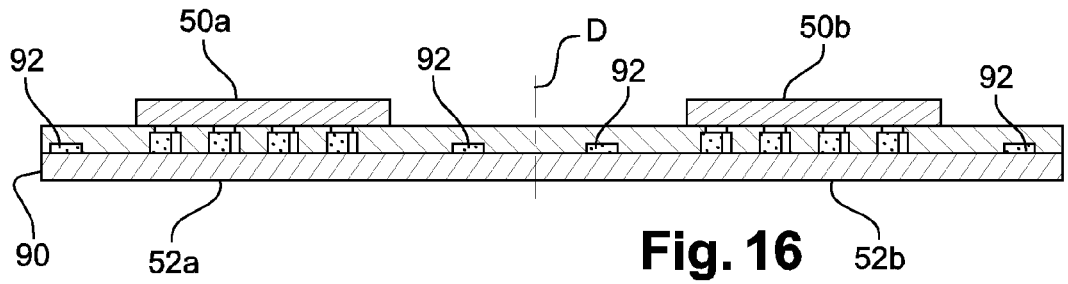
FIGS. 16 to 19 are simplified cross-section views of a method according to the disclosure enabling to expose areas covered with the underfill material.

Referring to FIG. 16, a plurality of components 50a, 50b have been hybridized on a substrate 90 defining a plurality of components 52a, 52b to be then individualized by sawing along sawing plane D. The hybridization is similar to that previously described, and comprises coating the inserts or the solid elements formed on substrate 90 with a negative photoresist, for example, a so-called "SU-8" epoxy resin followed by the insertion of the bumps or of the solid elements of components 50a, 50b into the corresponding elements of components 52a, 52b. The deposition of the epoxy resin has been performed full plate, that is, all over substrate 90, and particularly on areas comprising contacting areas 92 intended to be used subsequently to form connections of wire bonding type.

Figure 17:
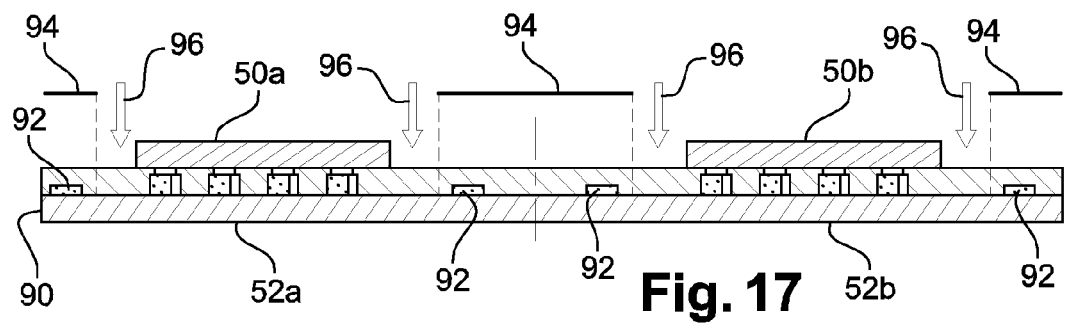

To free said areas, the method carries on with the application of a mask above the areas to be exposed, the mask being opaque to a predetermined radiation capable of allowing the removal of the exposed resin by a developer, followed by the application of said radiation to the hybridized assembly (FIG. 17).

Figure 18:
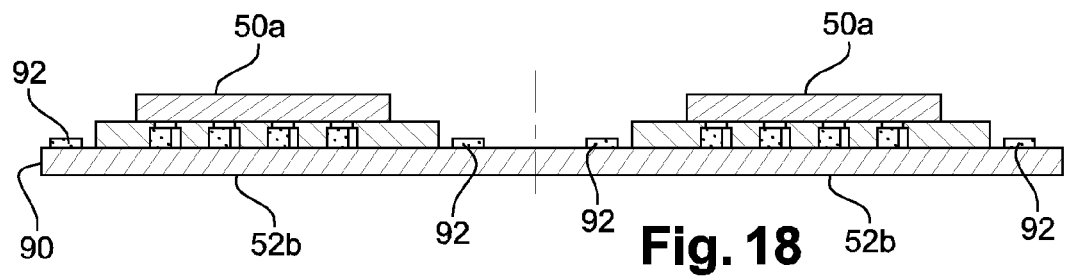

The mask is then removed and a developer is applied to remove the non-exposed resin portions, that is, the resin portions on the areas to be freed (FIG. 18).

Further, the exposed resin portions having crosslinked, they close the volumes between components 50a, 50b so that the resin portion contained in these volumes remains therein. A final crosslinking of the resin between components 50a, 50b is then obtained by thermal treatment, for example, by heating the assembly at 150° C. for 1 hour for the "SU-8"-type resin.

As a variation, components 50a are transparent to electromagnetic radiation 96 so that a crosslinking of the resin arranged between components 50a, 50b is obtained by application of the radiation.

Figure 19:
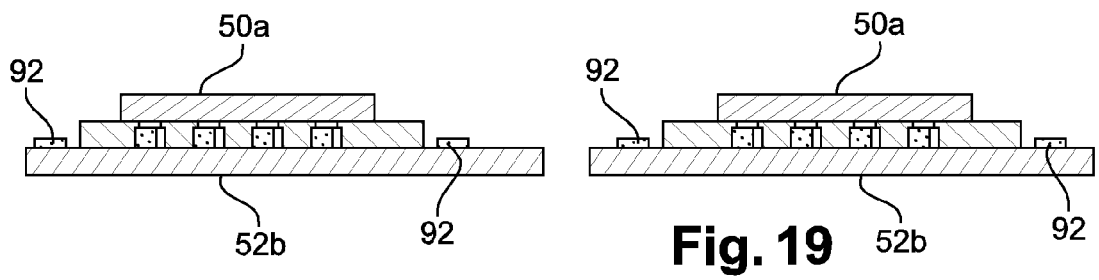

A sawing along plane A is then implemented to individualize the two components (FIG. 19).

The invention claimed is:

1. A method of assembling a first and a second electronic components, comprising:
    forming connection elements on an assembly surface of the first component and forming connection elements on an assembly surface of the second component;
    depositing a liquid layer of electrically-insulating curable material on the surface of assembly of the first and/or of the second component to coat at least the connection elements formed on said surface;
    arranging the first and second components on each other to place the connection elements of the second component in front of the connection elements of the first component; applying a force along a predetermined direction on the first and/or the second components to create electric interconnects each formed of a connection element of the first component and of a connection element of the second component; and
    curing the curable material,
    wherein the connection elements of the first component are hollow inserts having an open end and the connection elements of the second component are solid element, having a smaller hardness than the inserts, the application of the force resulting in the hollow elements being inserted into the solid elements;
    wherein each insert comprises:
        a metal core, non-oxidized over at least a portion of its surface, and having a greater hardness than the solid elements; and
        a metal layer covering at least said non-oxidized portion of the core, the first layer having a greater plasticity than the core and/or being made of a non-oxidizable metal;
    wherein the geometry of the hollow inserts and the geometry of the solid elements, and/or the relative positioning thereof during insertion, are selected to leave a portion of the open end of the hollow inserts free during the insertion; wherein the curable material comprises no deoxidizing flux, and
    wherein the open end of the hollow inserts has a plurality of branches partially arranged outside of the solid elements during the insertion.

2. The method of assembling a first and a second electronic components of claim 1, wherein a length of the hollow inserts along an axis perpendicular to the assembly direction is greater than a length of the solid elements along said axis.

3. The method of assembling a first and a second electronic components of claim 1, wherein the hollow inserts are inserted on one edge of the solid elements.

4. The method of assembling a first and a second electronic components of claim 1, wherein the curable material has an electric resistivity greater than $10^{12}$ ohms/cm.

5. A method of assembling a first and a second electronic components, comprising:
    forming connection elements on an assembly surface of the first component and forming connection elements on an assembly surface of the second component;
    depositing a liquid layer of electrically-insulating curable material on the surface of assembly of the first and/or of the second component to coat at least the connection elements formed on said surface;
    arranging the first and second components on each other to place the connection elements of the second component in front of the connection elements of the first component; applying a force along a predetermined direction on the first and/or the second components to create electric interconnects each formed of a connection element of the first component and of a connection element of the second component; and curing the curable material, wherein the connection elements of the first component are hollow inserts having an open end and the connection elements of the second component are solid element, having a smaller hardness than the inserts, the application of the force resulting in the hollow elements being inserted into the solid elements;

wherein each insert comprises:
- a metal core, non-oxidized over at least a portion of its surface, and having a greater hardness than the solid elements; and
- a metal layer covering at least said non-oxidized portion of the core, the first layer having a greater plasticity than the core and/or being made of a non-oxidizable metal;

wherein the geometry of the hollow inserts and the geometry of the solid elements, and/or the relative positioning thereof during insertion, are selected to leave a portion of the open end of the hollow inserts free during the insertion;

wherein the curable material comprises no deoxidizing flux, wherein the layer of curable material is deposited on a predetermined portion of the assembly surface, wherein the curable material is a negative photoresist capable of becoming insoluble in a predetermined developer consecutively to the application of a predetermined radiation, and wherein consecutively to the insertion of the hollow inserts into the solid elements:

said radiation is applied to the resin layer, except for the resin layer portion covering said portion of the assembly surface; and the photoresist covering said area is removed by applying the developer.

6. The method of assembling a first and a second electronic components of claim 5, wherein a length of the hollow inserts along an axis perpendicular to the assembly direction is greater than a length of the solid elements along said axis.

7. The method of assembling a first and a second electronic components of claim 5, wherein the hollow inserts are inserted on one edge of the solid elements.

8. The method of assembling a first and a second electronic components of claim 5, wherein the curable material has an electric resistivity greater than $10^{12}$ ohms/cm.

* * * * *